United States Patent [19]

Iwamoto et al.

[11] Patent Number: 4,983,969
[45] Date of Patent: Jan. 8, 1991

[54] SUCCESSIVE APPROXIMATION ANALOG TO DIGITAL CONVERTER

[75] Inventors: Yoshihiro Iwamoto, Kawasaki; Tetsuya Iida, Yokohama, both of Japan

[73] Assignee: Kabushiki Kaisha Toshiba, Kawasaki, Japan

[21] Appl. No.: 287,212

[22] Filed: Dec. 20, 1988

[30] Foreign Application Priority Data

Dec. 23, 1987 [JP] Japan ................................ 62-325682

[51] Int. Cl.$^5$ ............................................ H03M 1/06
[52] U.S. Cl. ..................................... 341/118; 341/155
[58] Field of Search ................. 341/118, 141, 163, 155

[56] References Cited

U.S. PATENT DOCUMENTS

| 4,228,423 | 10/1980 | Schwerdt | 341/118 |
| 4,609,906 | 9/1986 | Wiegel | 341/141 |
| 4,799,041 | 1/1989 | Layton | 341/158 |

FOREIGN PATENT DOCUMENTS 0164747 12/1985 European Pat. Off. .

OTHER PUBLICATIONS

Maxim 1987 Data Converter and Voltage References, pages from 1-47 through 1-58.
1976 IEEE International Solid State Circuits Conference, pp. 154-155.

Primary Examiner—William M. Shoop, Jr.
Assistant Examiner—Helen Kim
Attorney, Agent, or Firm—Finnegan, Henderson, Farabow, Garrett and Dunner

[57] ABSTRACT

To compensate for an offset of an A/D converter, a predetermined reference signal is supplied to the A/D converter. Based on the output signal of the A/D converter, the amount of the offset for this converter is acquired. A multiplexer outputs a compensation signal which serves to cancel out the acquired offset amount, the output of this multiplexer is subjected to analog addition to the analog input signal, and the offset of this A/D converter is compensated for at the input stage.

17 Claims, 8 Drawing Sheets

| DIGITAL INPUT | | | | | D/A OUTPUT (V) | |
|---|---|---|---|---|---|---|
| MSB | 2nd | 3rd | 4th | LSB | NO OFFSET | -½LSB OFFSET |
| 0 | 0 | 0 | 0 | 0 | 0.0 | 0.00 |
| 0 | 0 | 0 | 0 | 1 | 0.1 | 0.05 |
| 0 | 0 | 0 | 1 | 0 | 0.2 | 0.15 |
| 0 | 0 | 0 | 1 | 1 | 0.3 | 0.25 |
| 0 | 0 | 1 | 0 | 0 | 0.4 | 0.35 |
| 0 | 0 | 1 | 0 | 1 | 0.5 | 0.45 |
| 0 | 0 | 1 | 1 | 0 | 0.6 | 0.55 |
| 0 | 0 | 1 | 1 | 1 | 0.7 | 0.65 |
| 0 | 1 | 0 | 0 | 0 | 0.8 | 0.75 |
| 0 | 1 | 0 | 0 | 1 | 0.9 | 0.85 |
| 0 | 1 | 0 | 1 | 0 | 1.0 | 0.95 |
| 0 | 1 | 0 | 1 | 1 | 1.1 | 1.05 |
| 0 | 1 | 1 | 0 | 0 | 1.2 | 1.15 |
| 0 | 1 | 1 | 0 | 1 | 1.3 | 1.25 |
| 0 | 1 | 1 | 1 | 0 | 1.4 | 1.35 |
| 0 | 1 | 1 | 1 | 1 | 1.5 | 1.45 |
| 1 | 0 | 0 | 0 | 0 | 1.6 | 1.55 |
| 1 | 0 | 0 | 0 | 1 | 1.7 | 1.65 |
| 1 | 0 | 0 | 1 | 0 | 1.8 | 1.75 |
| 1 | 0 | 0 | 1 | 1 | 1.9 | 1.85 |
| 1 | 0 | 1 | 0 | 0 | 2.0 | 1.95 |
| 1 | 0 | 1 | 0 | 1 | 2.1 | 2.05 |
| 1 | 0 | 1 | 1 | 0 | 2.2 | 2.15 |
| 1 | 0 | 1 | 1 | 1 | 2.3 | 2.25 |
| 1 | 1 | 0 | 0 | 0 | 2.4 | 2.35 |
| 1 | 1 | 0 | 0 | 1 | 2.5 | 2.45 |
| 1 | 1 | 0 | 1 | 0 | 2.6 | 2.55 |
| 1 | 1 | 0 | 1 | 1 | 2.7 | 2.65 |
| 1 | 1 | 1 | 0 | 0 | 2.8 | 2.75 |
| 1 | 1 | 1 | 0 | 1 | 2.9 | 2.85 |
| 1 | 1 | 1 | 1 | 0 | 3.0 | 2.95 |
| 1 | 1 | 1 | 1 | 1 | 3.1 | 3.05 |

F I G. 2 (PRIOR ART)

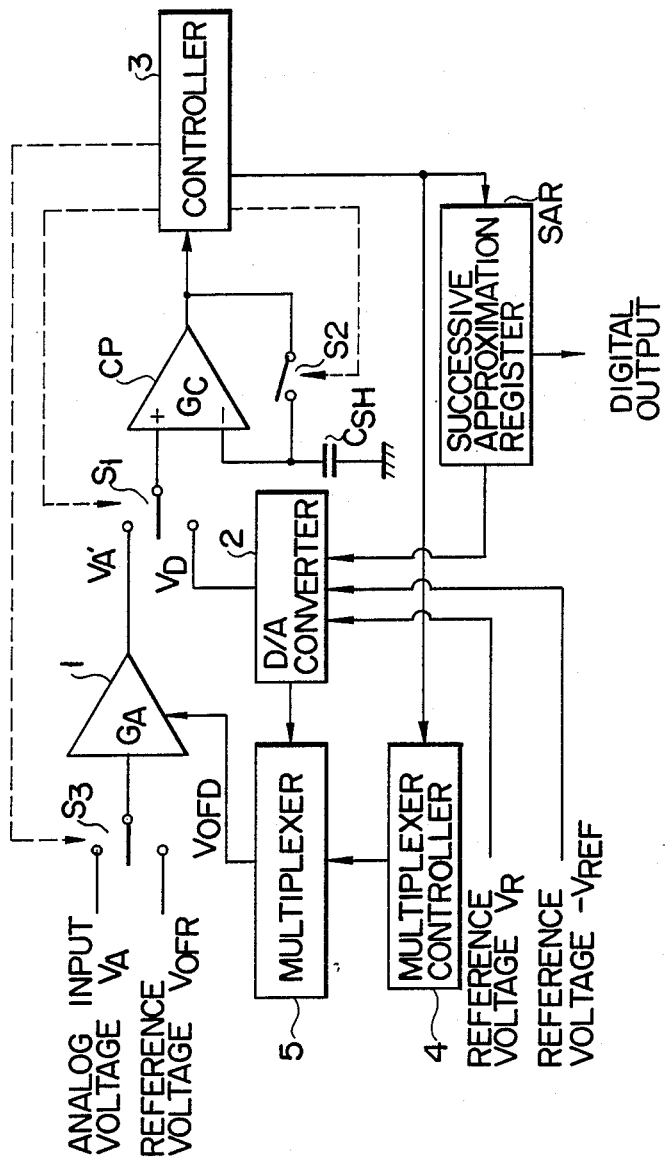
F I G. 3

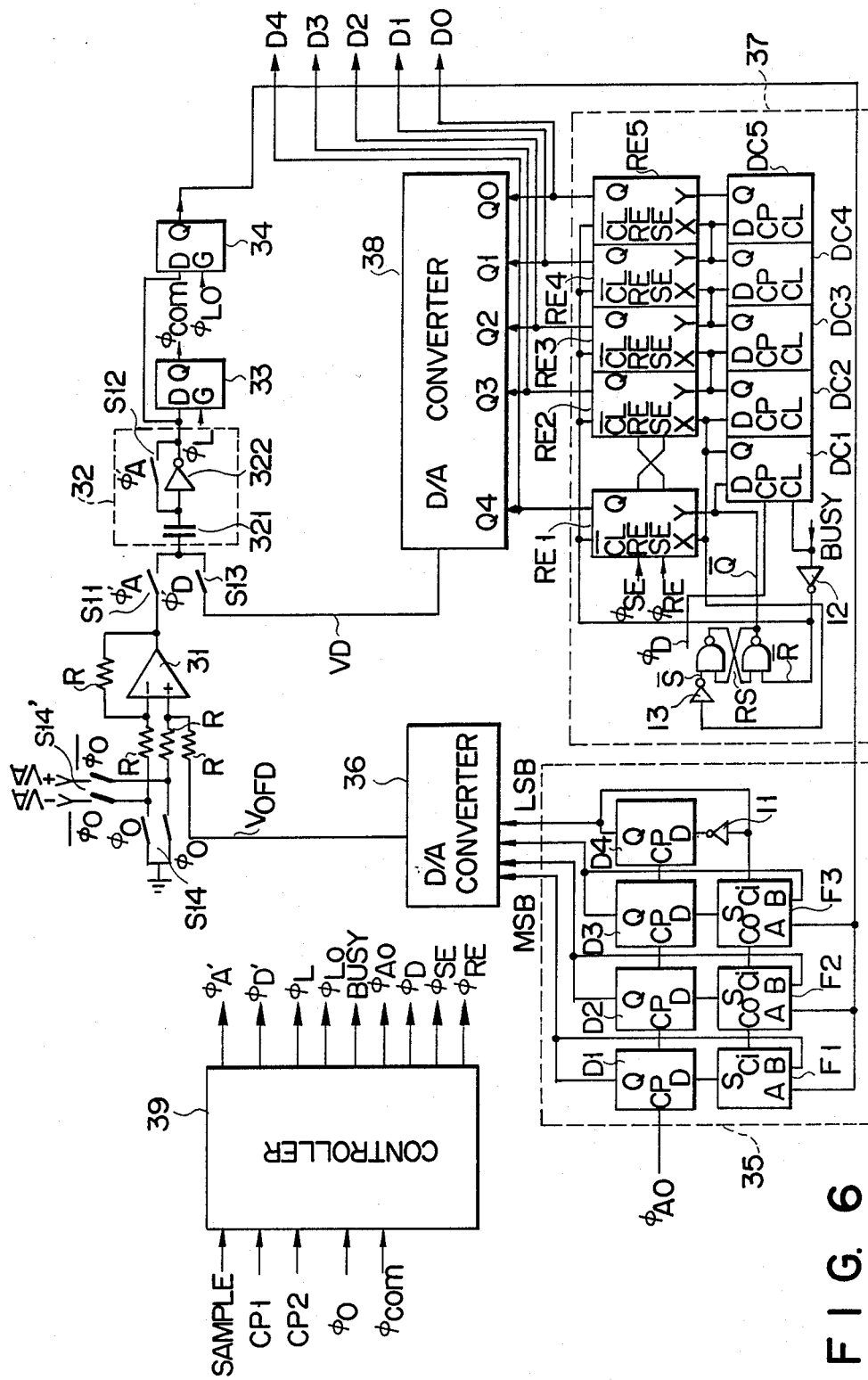
F I G. 6

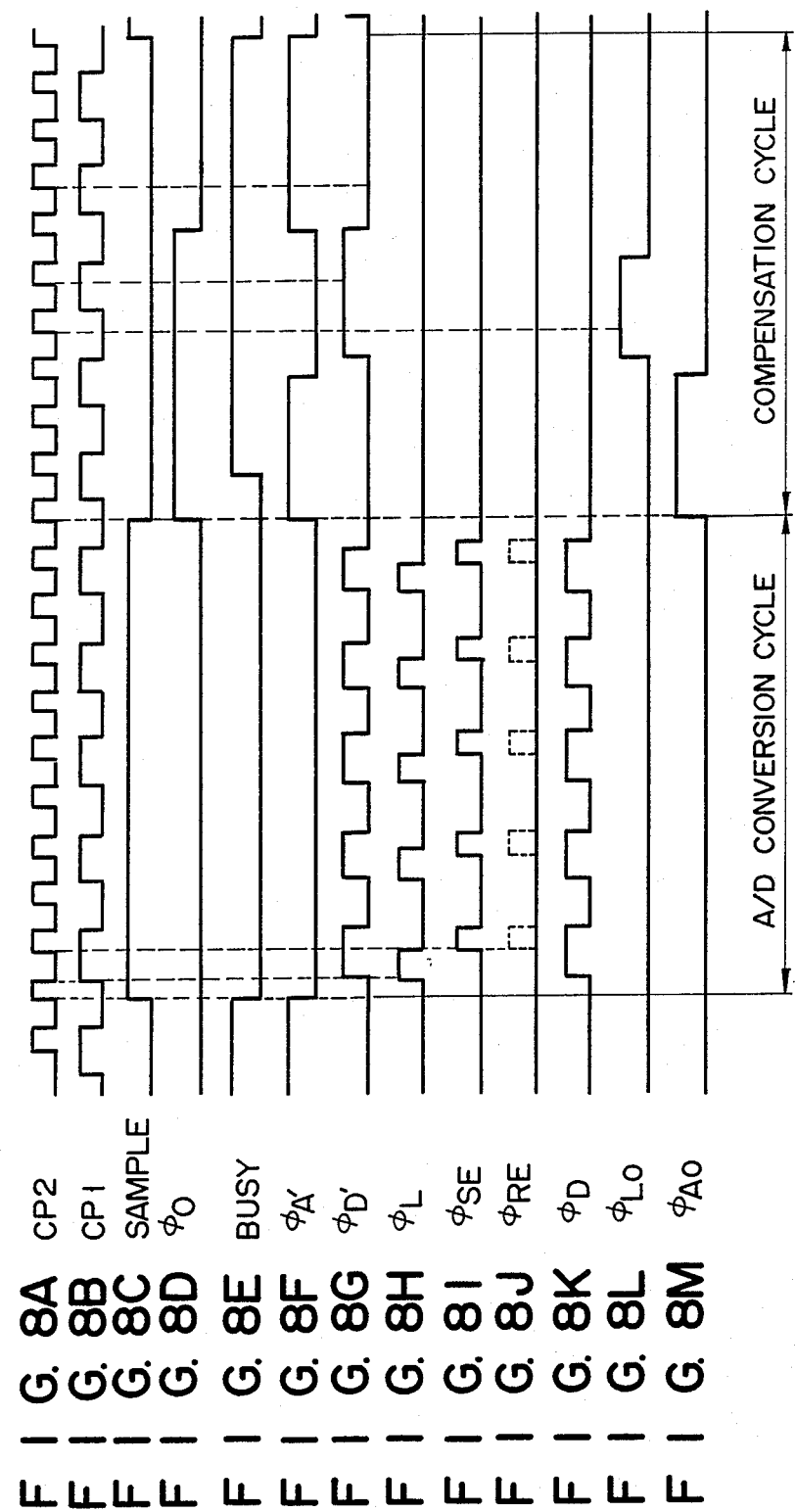

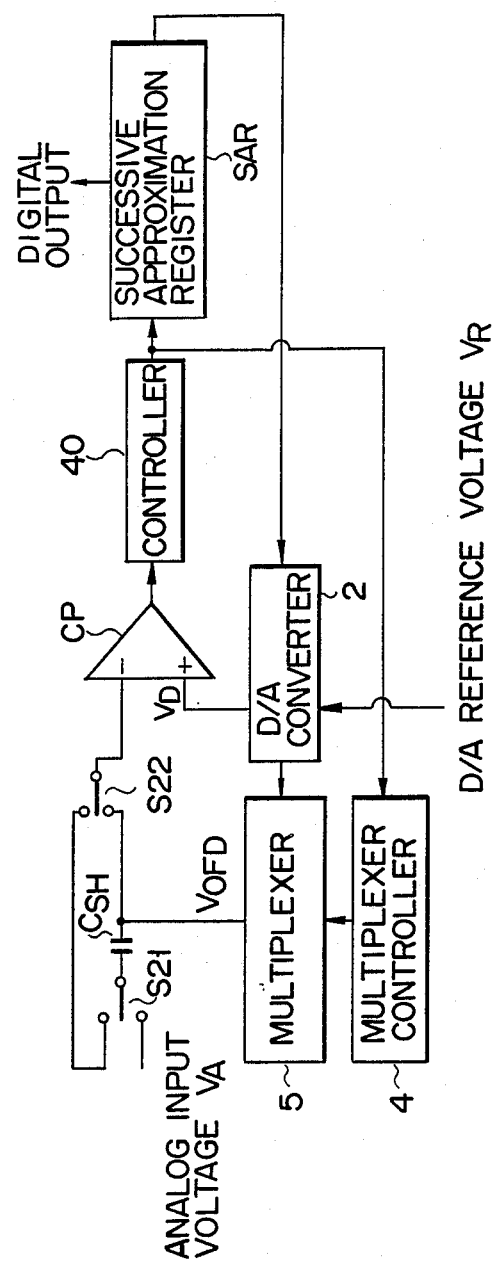
F I G. 9

SUCCESSIVE APPROXIMATION ANALOG TO DIGITAL CONVERTER

BACKGROUND OF THE INVENTION

1. Field of the Invention

The present invention relates to an improvement of a successive approximation analog to digital (hereinafter referred to as A/D) converter, and, more particularly, to an A/D converter having an offset compensation circuit for automatically compensating for an offset error of an A/D converter.

2. Description of the Related Art

FIG. 1 illustrates an example of the structure of a successive approximation A/D converter of a voltage comparison type. Such an A/D converter is disclosed in, for example, "Digest of Technical Papers", p154, of 1976, IEEE International Solid-state Circuits Conference.

The converting operation of the A/D converter shown in FIG. 1 will be described with reference to FIG. 2. For ease of understanding, it is assumed that the input data and analog output voltage $V_D$ of a D/A converter 51 has the relation as indicated in the case of "No Offset Output" in FIG. 2 and that the analog input voltage $V_A$ is 2.3 V.

A controller 50 connects a switch $S_1$ to the analog input voltage $V_A$ and turns a switch $S_2$ ON. A charging voltage $V_A$ of a capacitor $C_{SH}$ is $V_A = 2.3$ V $+ V_{COF}$, where $V_{COF}$ is an offset voltage of a comparator CP and is ideally 0 V. Controller 50 sets only the most significant bit (MSB) of a 5-bit successive approximation register SAR to "1". The output of this register SAR is "10000". It is clear from FIG. 2 that the output voltage $V_D$ of D/A converter 51 is 1.6 V. Controller 50 then turns switch $S_2$ off and connects switch $S_1$ to the output $V_D$ of D/A converter 51.

Comparator CP compares the voltage $V_A$ held in capacitor $C_{SH}$ with the output voltage $V_D$ of D/A converter 51. In this case, $V_A (= 2.3$ V$) > V_D (= 1.6$ V$)$. While keeping the MSB of register SAR at "1" (MSB of register SAR is reset to "0" when $V_A < V_D$), controller 50 sets the second bit, one bit lower than the MSB, to "1". The output of register SAR becomes "11000" and the output of D/A converter 51, $V_D$, becomes 2.4 V.

Comparator CP compares the voltage $V_A$ with the voltage $V_D$ and indicates $V_A < V_D$. In response to the comparison result, controller 50 resets the second bit of register SAR to "0" and sets the third bit to "1". As a result, the output of register SAR becomes "10100" with the voltage $V_D$ being 2.0 V. Accordingly, the comparison result from comparator CP is $V_A > V_D$. Controller 50 then set the fourth bit of register SAR at "1" while keeping the third bit of register SAR at "1".

The output of register SAR becomes "10110" and the output voltage $V_D$ become 2.2 V, which means $V_A > V_D$. Controller 50 then sets the least significant bit (LSB) of register SAR to "1" while keeping the fourth bit of register SAR at "1". The output of register SAR becomes "10111" and the output voltage $V_D$ becomes 2.3 V, which means $V_A = V_D$.

To minimize the quantitative error in practical A/D converter, D/A converter 51 is given an offset corresponding to $-\frac{1}{2}$ LSB (0.05 V in this case). When the input analog voltage $V_A$ is 2.25 $< V_A <$ 2.35 V, the A/D conversion output is therefore "10111".

In sampling the analog input voltage $V_A$ in the A/D converter shown in FIG. 1, the sum of this voltage $V_A$ and the offset voltage $V_{COF}$ of comparator CP is charged in capacitor $C_{SH}$, and this charged voltage ($V_A + V_{COF}$) becomes a reference voltage for the comparing operation of comparator CP. Thus, the comparison result from comparator CP is expressed as $|G_C| \times \{(V_D + V_{COF}) - (V_A + V_{COF})\}$ where $|G_C|$ is the absolute value of the gain of the comparator. In the case where a comparator CP having a sample/hold function is used, then even if an offset voltage exists in comparator CP, the comparison result is free from the influence of such an offset voltage.

It often occurs that the analog input voltage $V_A$ input into an A/D converter does not have a sufficiently large amplitude. In such a case, this results in the resolution of the A/D converter being under-utilized. To cater for this situation, therefore, an amplifier 52 for amplifying the analog input voltage is often provided, as indicated by the broken line in FIG. 1.

However, an offset voltage $V_{AOF}$ is generated between the input and output terminals of amplifier 52, therefore comparator CP will have an output of $|G_C| \times [(V_D + V_{COF}) - \{|G_A| \times (V_A + V_{AOF}) + V_{COF}\}]$. As indicated by this equation, when the offset voltage $V_{AOF}$ exists, the offset voltage of amplifier 52 affects the output of comparator CP, so that the result of a comparison of the output voltage $V_D$ of D/A converter 51 with the analog input voltage $V_A$ would not reflect the true value, resulting in generation of a large offset error.

Another example of an A/D converter is a type which uses a comparator having no sample/hold function and an exclusive sample/hold circuit which performs the sample/hold operation on the analog input voltage $V_A$ and supplies the resultant voltage to the comparator. With this structure, an offset, if present between the input and output of comparator CP, would, unlike in the case of the structure shown in FIG. 1, generate an offset error.

SUMMARY OF THE INVENTION

Accordingly, it is an object of this invention to provide a successive approximation A/D converter with a smaller offset error.

To achieve this object, there is provided an A/D converter which has:

A/D converting means for converting an analog input signal into digital data;

reference signal supplying means, coupled to the A/D converting means, for supplying a predetermined reference signal to the A/D converting means during a compensation period in which an offset for the A/D converter is compensated for;

offset attaining means, coupled to the A/D converting means, for attaining an offset amount of the A/D converting means at a time the reference signal is supplied to the A/D converting means;

compensation signal output means, coupled to the offset attaining means, for outputting an analog compensation signal that cancels out an offset of the A/D converting means in accordance with the attained offset amount; and offset canceling means, coupled to the compensation signal output means, for performing analog addition of the compensation signal and the analog input signal supplied to the A/D converting means, to cancel out the offset of the A/D converting means, during a conversion period in which the analog input signal is converted into corresponding digital data.

With the above arrangement, since an offset voltage is compensated for by means of the A/D converter system itself, it is therefore possible to compensate for an offset which may be generated in the entire system. Accordingly, an A/D converter with a significantly small offset error can be realized.

BRIEF DESCRIPTION OF THE DRAWINGS

FIG. 2 is a table illustrating the operation of the D/A converter shown in FIG. 1;

FIG. 3 is a block diagram illustrating the structure of a voltage comparison type successive approximation A/D converter according to one embodiment of this invention;

FIG. 6 is a circuit diagram exemplifying the structure of an A/D converter according to another embodiment of this invention;

FIGS. 8A through 8M are timing charts for explaining the operation of the circuit shown in FIG. 6; and FIG. 9 is a diagram illustrating the structure of a successive approximation A/D converter according to a further embodiment of this invention.

DETAILED DESCRIPTION OF THE PREFERRED EMBODIMENTS

Figure 1:
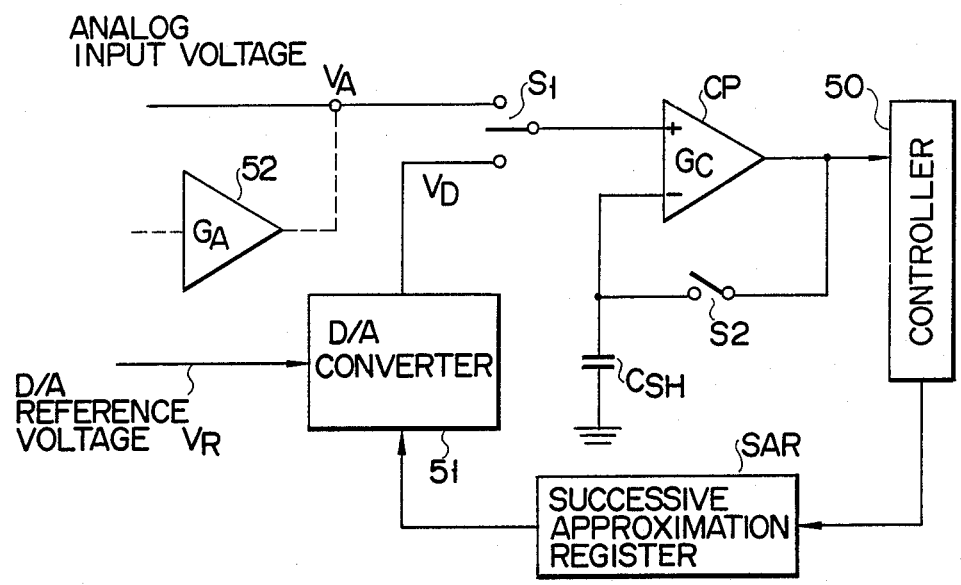
FIG. 1 is a block diagram illustrating the structure of a conventional successive approximation A/D converter.

An A/D converter according to one embodiment of this invention will now be described below, with reference to the accompanying drawings.

Referring to FIG. 3, description will now be made of the structure of a voltage comparison type successive approximation A/D converter according to this embodiment. First, an analog voltage signal $V_A$ which is to be converted into digital data is supplied from, for example, an external device to one input terminal of a third switch $S_3$, and an offset compensation reference voltage $V_{OFR}$ is supplied from, for example, an external device to the other input terminal thereof. In response to a control signal from a controller 3, third switch $S_3$ selects and outputs either voltage signal $V_A$ or offset compensation reference voltage $V_{OFR}$. The output of third switch $S_3$ is supplied to an input amplifier (e.g., an operational amplifier) 1 having gain $|G_A|$. An output voltage $V_A'$ of input amplifier 1 and an output voltage $V_D$ of a D/A converter 2 are supplied to a first switch $S_1$. An output signal of switch $S_1$ is supplied to a non-inverting input terminal (+) of a comparator CP having gain $|G_C|$; comparator CP can be constituted by an operational amplifier. A sample/hold capacitor $C_{SH}$ is coupled between an inverting input terminal (−) and the ground terminal, and a second switch $S_2$, which is an ON/OFF switch, is coupled between the output terminal and inverting input terminal (−) of comparator CP. The output signal of comparator CP is supplied to controller 3, which controls the operation of this A/D converter, and controller 3, supplies control signals to switches $S_1$, $S_2$, and $S_3$, to a successive approximation register SAR, and to a multiplexer controller 4 (the latter two components will be described later). The output (digital code output) of register SAR, which is the A/D conversion output of the A/D converter, is supplied to D/A converter 2, which is also supplied with a D/A conversion reference voltage $V_R$ and an offset reference voltage $-V_{REF}$.

The A/D converter according to this embodiment also includes an offset compensation analog multiplexer 5 which is controlled by multiplexer controller 4. Multiplexer controller 4 is controlled by controller 3, to change the output voltage $V_{OFD}$ of multiplexer 5, which can switch the output voltage by a 10 mV step, for example. The output voltage $V_{OFD}$ of multiplexer 5 is supplied as a bias signal to input amplifier 1, to be added to input voltage $V_A$ in analog form.

Figure 4:
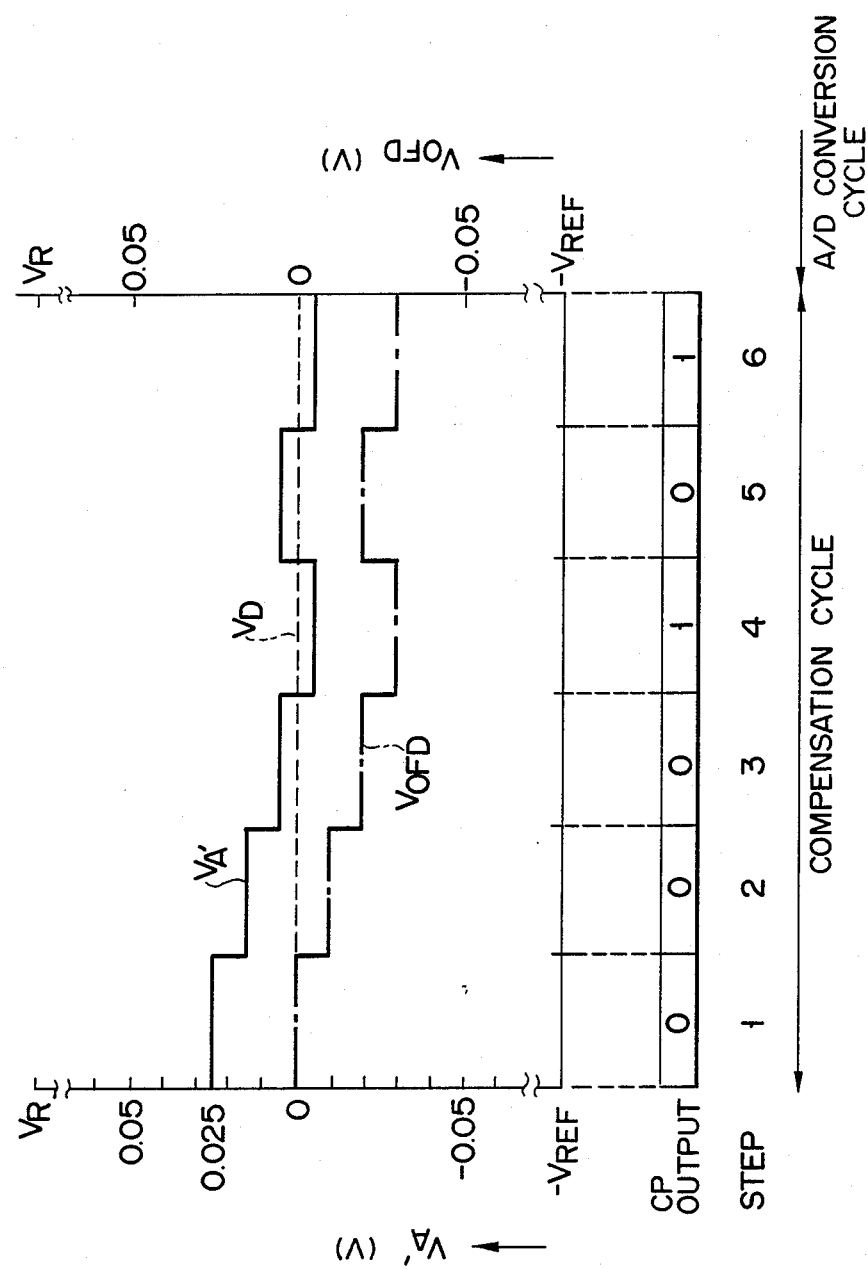
FIG. 4 is a diagram for explaining the offset error compensation operation in the A/D converter shown in FIG. 3.

The operation of the A/D converter shown in FIG. 3 will now be described below, with reference to FIG. 4.

The A/D converter according to this embodiment performs an operation for compensating for an offset error on each occasion A/D conversion has been carried out N times (N being a positive integer). The period in which A/D conversion is executed is called an A/D conversion cycle, and the period in which compensation operation is executed, a compensation cycle.

To begin with, description will be made of the operation in the compensation cycle in the circuit shown in FIG. 3. In the description which follows, the offset voltage $V_{COF}$ of comparator CP will be disregarded since, as has already been explained in the description of the prior art, it does not affect the A/D conversion operation, and the offset compensation reference voltage $V_{OFR}$, which is a reference signal for compensating for the offset voltage of amplifier 1, will be assumed to be 0 V.

Controller 3 initializes the output voltage $V_D$ of D/A converter 2 to 0 V, and the output voltage $V_{OFD}$ of multiplexer 5 to 0 V.

In the first step of the offset compensation cycle, controller 3 causes third switch $S_3$ to select the offset compensation reference voltage $V_{OFR}$ and first switch $S_1$ to select the output voltage $V_A'$ of amplifier 1, and turns second switch $S_2$ ON. Given that the gain $|G_A|$ of amplifier 1 is 1, the output voltage $V_A'$ of amplifier 1 is ideally 0 V, which is the analog sum of the voltage $V_{OFR}$ and voltage $V_{OFD}$. Since there exists an offset voltage $V_{AOF}$ of amplifier 1, however, some voltage is actually generated. For ease of understanding, let us assume that the offset voltage $V_{AOF}$ is 25 mV. The capacitor $C_{SH}$ is charged by the output of comparator CP and its terminal voltage is 25 mV. Upon completion of the charging, controller 3 turns second switch $S_2$ OFF and permits first switch $S_1$ to select the output voltage $V_D$ of D/A converter 2, which is 0 V. Comparator CP then compares the voltage $V_D$ (0 V) with the terminal voltage $V_A'$ (25 mV) capacitor $C_{SH}$; in this case, $V_A' > V_D$ and comparator CP supplies a signal of level "0" to controller 3.

In the second step, controller 3 sends a signal indicating the comparison result to multiplexer controller 4, which controls analog multiplexer 5 so that the output voltage $V_{OFD}$ of multiplexer 5 is reduced by 10 mV; accordingly, multiplexer 5 outputs a voltage $V_{OFD}$ of −10 mV (0-10 mV). When, on the other hand, the comparison result of comparator CP is "0", multiplexer controller 4 increases the output voltage $V_{OFD}$ of multiplexer 5 by 10 mV. A signal acquired by analog addition of the offset compensation reference voltage $V_{OFR}$ and the output signal $V_{OFD}$ of multiplexer 5 becomes a substantial input signal to input amplifier 1. Consequently, as shown in FIG. 4, the output voltage $V_A'$ of input amplifier 1 becomes 15 mV, comparator CP then compares the output voltage $V_A'$ with the reference voltage $V_D$, and as is shown in this FIGURE, the comparison result of comparator CP becomes "0".

In the third step, the output voltage $V_{OFD}$ of multiplexer 5 becomes $-20$ mV and the output voltage $V_A'$ of input amplifier 1 is 5 mV, so that the comparison result of comparator CP is "0".

In the fourth step, the output voltage $V_{OFD}$ of multiplexer 5 becomes $-30$ mV and the output voltage $V_A'$ of input amplifier 1 is $-5$ mV, with the comparison result of comparator CP being "1".

In the fifth step, the output voltage $V_{OFD}$ of multiplexer 5 becomes $-20$ mV and the output voltage $V_A'$ of input amplifier 1 is $+5$ mV, with the comparison result of comparator CP being "0".

The operation in the compensation cycle permits the output voltage $V_{OFD}$ to follow the offset voltage of amplifier 1, which changes toward the voltage of the opposite polarity side.

Description will now be made of the normal A/D conversion operation which follows the offset compensation cycle.

In the first step of the A/D conversion cycle, controller 3 connects first switch $S_1$ to the analog input voltage $V_A$ and turns second switch $S_2$ ON. A signal acquired by adding the analog input voltage $V_A$ and the output signal $V_{OFD}$ of multiplexer 5 is a substantial input to amplifier 1. Consequently, the output voltage $V_A'$ of amplifier 1 is $V_A + V_{OFD} + V_{AOF}$ and the terminal voltage of capacitor $C_{SH}$ is $V_A + V_{OFD} V_{AOF}$. Since $V_{OFD} + V_{AOF} = 0$ (substantially), the terminal voltage of capacitor $C_{SH}$ is substantially only the input voltage $V_A$.

Thereafter, the terminal voltage of capacitor $C_{SH}$ is compared with the output voltage $V_D$ of D/A converter 2, the content of register SAR is sequentially altered in accordance with the comparison result, as explained in the description of the prior art, and the input ana log voltage $V_A$ is converted into a digital signal.

Figure 5:
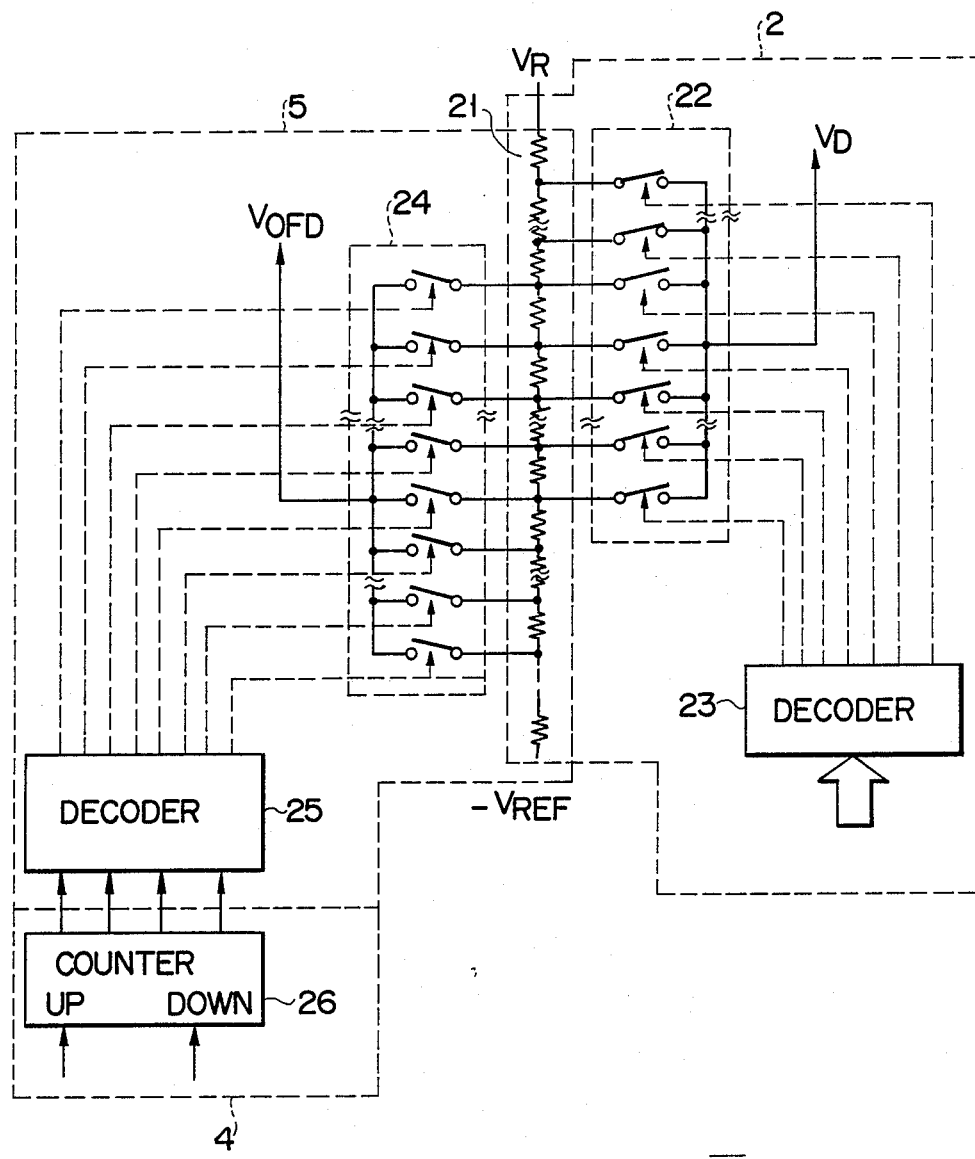
FIG. 5 is a circuit diagram illustrating a practical example of a D/A converter and an offset compensation multiplexer shown in FIG. 3.
Figure 7:
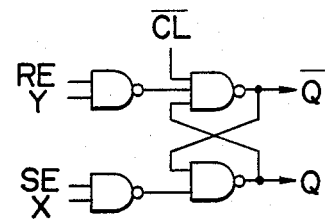
FIG. 7 is a circuit diagram for explaining the structure of a flip-flop shown in FIG. 6.

Referring now to FIG. 5, a detailed description will be made of the structures of D/A converter 2, analog multiplexer controller 4, and offset compensation analog multiplexer 5, each of which is shown in FIG. 3.

As can be seen in FIG. 5, a voltage divider 21 is provided between the D/A conversion reference voltage $V_R$ and the offset reference voltage $-V_{REF}$, and is shared by D/A converter 2 and multiplexer 5. Voltage divider 21 is constituted by a plurality of series-connected resistors, with nodes therebetween being coupled with terminals, the locations and quantity of which are determined in accordance with the operation of D/A converter 2 and multiplexer 5. In this embodiment, the resistances of the resisters of voltage divider 21 are set such that the voltage between adjacent terminals is 10 mV. Thirty-two terminals of voltage divider 21, having terminal voltages ranging from 0 V to 3.1 V, are coupled to the output terminal of D/A converter 2 via respective switches 22, only one of switches 22 being turned ON in accordance with the output signal of a decoder 23, which is supplied with the held data of successive approximation register SAR.

Sixteen terminals of voltage divider 21, having 5 terminal voltages ranging from $-0.07$ V to 0.08 V, are coupled to the output terminal of multiplexer 5 via respective switches 24, only one of switches 24 being turned ON in response to the output signal of a decoder 25, which is supplied with the 4-bit held data of a counter 26. Counter 26 is supplied with a count-up pulse from controller 3 when the output of comparator CP is "1", and is supplied with a count-down pulse when this comparator output is "0".

With the above arrangement, switches 22 corresponding to 5-bit data held in register SAR are turned ON and the corresponding voltage is generated in D/A converter 2 in the A/D conversion cycle.

In the offset compensation cycle, the count value of counter 26 is decremented by one when the comparator output is "0" and is incremented by one when the comparator output is "1". Then, switches 24 corresponding to the count value of counter 26 are turned ON and the corresponding analog voltage is supplied as the voltage $V_{OFD}$ to amplifier 1.

Referring now to FIG. 6, description will be made of an A/D converter having an offset compensation circuit according to another embodiment of this invention.

In the circuit shown in FIG. 6, a subtraction amplifier 31 is used as an input amplifier. Subtraction amplifier 31 has its input terminals supplied with an input analog voltage $V_A$ and an inverted voltage $-V_A$ resistors R and switches $S_{14}'$ which controlled by a clock signal $\overline{\phi 0}$. The input terminals of subtraction amplifier 31 are grounded through a switch $S_{14}$ which is controlled by a clock signal $\phi 0$, the output terminal of subtraction amplifier 31 being coupled to an input terminal of a chopper type comparator 32 having a sample/hold function, via a switch $S_{11}$ which is controlled by a clock signal $\phi_A'$. Comparator 32 includes a capacitor 321 one end of which is coupled to switch $S_{11}$, an inverter 322 having an input terminal which is coupled to the other end of capacitor 321, and a switch $S_{12}$, one end of which is coupled to the input terminal of inverter 322 and the other end of which is coupled to the output terminal thereof and controlled by the clock signal $\phi_A'$.

The output of inverter 322 is supplied as the output of comparator 32 to D flip-flops 33 and 34. D flip-flop 33 holds the output of comparator 32 in synchronism with a clock signal $\phi_L$ and sends its Q output, $\phi$com, to controller 3 for A/D conversion. D flip-flop 34, on the other hand, holds the output of comparator 32 in synchronism with a clock signal $\phi_{LO}$ for offset compensation, and its Q output is supplied to a counter 35, which is constituted by full adders F1 to F3, D flip-flops D1 to D4, and an inverter I1. Full adders F1–F3 each have an A input terminal which is supplied with the Q output of flip-flop 34, and the sum data of full adders F1–F3 is supplied to the D input terminals of the corresponding D flip-flops D1–D3. The Q outputs of D flip-flops 34 become the MSB to the second bit of counter 35 and are supplied to B input terminals of the corresponding full adders F1–F3, while the Q output of D flip-flop D4 of the lowest stage becomes the LSB of counter 35 and is supplied through inverter I1 to the D input terminal of flip-flop D4. The Q output of D flip-flop D4 is also supplied to the carry input terminal of full adder F3, the carry outputs of full adders F2 and F3 are respectively supplied to the carry input terminals of full adders F1 and F2, each higher by one than the former full adders F2 and F3, and D flip-flops D1 to D4 are supplied with a clock signal $\phi_{AO}$.

The output of counter 35 is supplied to a D/A converter 36 whose output signal $V_{OFD}$ is supplied through resistor R to the positive input terminal of subtraction amplifier 31, and is added to the analog input signal $+V_A$.

The Q output signal of D flip-flop 33 is supplied to a controller 39, to control a digital code of a register 37. Based on control signals SAMPLE, CP1, CP2, $\phi_0$, each externally supplied, and $\phi$com from D flip-flop 33, controller 39 outputs control signals $\phi_A'$, $\phi_D'$, $\phi_L$, $\phi_{LO}$, BUSY, $\phi_{AO}$, $\phi_D$, $\phi_{SE}$, and $\phi_{RE}$.

Register 37 is constituted by five registers RE1 to RE5 and five D flip-flops DC1 to DC5 each with a clear terminal. The set clock signal $\phi_{SE}$ from controller 39 is supplied to a reset terminal RE of the highest register RE1 and to the set terminals SE of the remaining four lower registers RE2–RE5, the reset clock signal $\phi_{RE}$ from controller 39 is supplied to a set terminal SE of register RE1 and to the reset terminals RE of the other four lower registers RE2–RE5, and the busy signal BUSY from controller 39 is supplied to the clear terminals of D flip-flops DC1–DC5 and to a reset terminal $\overline{R}$ of a RS flip-flop RS through an inverter I2. RS flip-flop RS has its $\overline{Q}$ terminal coupled to a Y terminal of highest register RE1 and to a D input terminal of highest D flip-flop DC1. The Q output of highest D flip-flop DC1 is supplied to an X input of highest register RE1, to an X input of second highest register RE2, and to a D input of second highest D flip-flop DC2, while the Q outputs of the other D flip-flops DC2–DC5 are supplied to the D inputs of those D flip-flops which are lower by one than flip-flop DC2–DC5, to Y inputs of the registers of the same digits, and to X inputs of the registers lower by one than flip-flops DC2–DC5. The Q output of highest D flip-flop is supplied to a set terminal $\overline{S}$ of RS flip-flop RS through an inverter I3, and the individual input terminals of D/A converter 38 are supplied with the Q outputs of the respective registers RE1–RE5; these Q outputs are digital outputs of the A/D converter. The output signal of D/A converter 38 is supplied to the input terminal of comparator 32 through a switch S13 that is controlled by the control signal $\phi_D'$.

Referring now to FIGS. 8A through 8M, a description will be given of the operation of the A/D converter shown in FIG. 6.

The control clock signals CP1, CP2, SAMPLE and $\phi_0$ shown in FIGS. 8A–8D are externally supplied to controller 39, which is also supplied with the signal $\phi$com from D flip-flop 33.

The reference clock CP1 has a period twice as greater as that of reference clock CP2. The signal SAMPLE is in synchronism with the signal CP2 and this embodiment provides a 5-bit digital output, so that the half cycle corresponds to five cycles of clock CP1. The period in which the sample signal SAMPLE has a "1" level is the A/D conversion cycle, and the period in which the sample signal SAMPLE has a "0" level is the offset compensation cycle.

The A/D conversion operation will be described below.

At the middle of the compensation cycle, controller 39 sets the signal BUSY at a high level and sets the MSB of register 37 to "1", as shown in FIG. 8E. At the second half of the compensation cycle, controller 39 sets the signal $\phi_A'$ at a high level and turns switches $S_{11}$ and $S_{12}$ ON as shown in FIG. 8F. Accordingly, the amplified voltage of the input analog voltage $V_A$ is sampled in capacitor 321 with the input terminal voltage and output terminal voltage of inverter 322 being forcibly set to have the same value. The sampled voltage is added with the offset compensation voltage $V_{OFD}$ from D/A converter 36. The above operation makes the A/D converter ready for A/D conversion.

Then, the A/D conversion cycle starts. As shown in FIGS. 8A, 8F and 8G, controller 39 renders the signal $\phi_A'$ to have a low level and the signal $\phi_D'$ to have a high level in synchronism with the rising of the signal SAMPLE.

The output signal of inverter 322 has a high level when the output voltage $V_D$ of decoder 38 is smaller than the sampled voltage, and it has a low level when the output voltage $V_D$ of decoder 38 is greater than the sampled voltage. The output of inverter 322 is latched by D flip-flop 33 in synchronism with the clock $\phi_L'$ shown in FIG. 8H, and the output signal $\phi$com of D flip-flop 33 is supplied to controller 39.

As shown in FIG. 8I, controller 39 outputs the clock signal $\phi_{SE}$ during the high-level duration of the signal SAMPLE in synchronism with the reference clock signal CP2. Controller 39 outputs the clock signal $\phi_{RE}$ shown in FIG. 8J when the signal $\phi$com is at a high level In response to the clock signal $\phi_{SE}$, the second bit of register 37 is set, and in response to the clock signal $\phi_{RE}$ (if output), the first bit of register 37 is reset. The updated content of register 37 is subjected to D/A conversion and the resultant data is compared with the voltage sampled in capacitor 321.

The same operation will be repeated thereafter. The output of register 37 at a 5-clock time is a digital output. The fifth clock of the clock signal $\phi_{SE}$ has no significance in this embodiment and is therefore neglected.

When the signal SAMPLE has a low level, the offset compensation cycle starts. With the signal $\phi_0$ being at a high level, switch $S_{14}$ is turned ON, and switch $S_{14}'$ is turned OFF. Amplifier 31 is supplied with the ground potential instead of the analog input voltage $V_A$. Controller 39 sets the clock signal $\phi_A'$ at a high level and turns switches $S_{11}$ and $S_{12}$ ON, and samples the output voltage of amplifier 31 in capacitor 321. Then, the clock signal $\phi_A'$ is set at a low level, switches $S_{11}$ and $S_{12}$ are turned OFF, the clock signal $\phi_D'$ is set at a high level, and the output voltage $V_D$ of D/A converter 38 is selected. At this time, the signal BUSY is at a high level and a low-level signal is supplied through inverter I2 to low active clear terminals $\overline{R}$ of registers RE1–RE5. As a result, the output data of register 37 becomes "0" and the output of D/A converter 38 becomes 0 V, which is then compared with the charging voltage of capacitor 321. If the charging voltage is greater than 0 V, inverter 322 outputs "1", and if the charging voltage is smaller, inverter 322 outputs "0". The output data of inverter 322 is latched by D flip-flop 34 in synchronism with the clock signal $\phi_{LO}$ shown in FIG. 8L. If the held data of D flip-flop 34 is "1", the count value of counter 35 is incremented in synchronism with the clock signal $\phi_{AO}$ shown in FIG. 8M. If the held data of D flip-flop 34 is "0", the count value of counter 35 is decremented in synchronism with the clock signal $\phi_{AO}$. The count value of counter 35 is subjected to D/A conversion by means of D/A converter 36 and is then supplied as the offset compensation voltage $V_{OFD}$ to amplifier 31. In the stable status, the amount of an offset does not rapidly change, so that only one offset compensation operation is completed in this embodiment.

Thereafter, the signal $\phi_0$ will have a low level, switch $S_{13}$ is opened, the signal $\phi_A'$ will have a high level, switches $S_{11}$ and $S_{12}$ are turned ON, and the analog input voltage $V_A$ is sampled in capacitor 321, thereby setting the A/D converter ready for the next conversion operation. The above completes the offset compensation cycle.

The Q output of D flip-flop 34 may be manipulated in such a way that the level of the output is does not vary in the offset stable period.

Even with an input amplifier being added, the A/D converters according to the above embodiments can automatically compensate for the offset voltage of the input amplifier in terms of input, without requiring an external circuit. Further, since the offset voltage is compensated for by using the entire successive approximation A/D converter system, the offset voltage generated in the overall system can be compensated. This can therefore realize an A/D converter with a significant less offset error. And, what is more, the following effects can be attained.

(1) Since no external circuit is required, this invention is advantageous for higher integration.

(2) This invention can be widely deal with even if any one of various amplifiers for inversion, noninversion and subtraction is used as an input amplifier.

(3) With the structure shown in FIG. 5 being utilized, for example, an exclusive D/A converter for offset compensation is not required since it can be constituted simply by adding an offset compensation analog multiplexer and its controller to an A/D converter for A/D conversion.

(4) The range of the offset compensation voltage and the resolution of offset compensation can be easily set to arbitrary values by the structure, and the control, of the analog multiplexer.

(5) Offset compensation is executed in accordance with the offset voltage generated. This will not cause a change in offset voltage with time or temperature drifting, which may be a problem in the case where an offset is compensated by an external circuit, or the like.

(6) Since a small offset compensation cycle is added to the A/D conversion cycle, the actual A/D conversion time will not be significantly delayed.

(7) If a counter or the like is used as multiplexer controller 4, the amount of an offset can be detected by reading the content of the counter.

Although, in the above embodiments, the output voltage of the offset compensation multiplexer is changed for each voltage corresponding to the 1LSB, this invention is not restricted to this particular case but may be applicable to the case where this output voltage is stopped until a certain amount of error is generated, or it is changed for each voltage corresponding to 2LSB. Further, if an increase in the circuit scale or size is insignificant, those circuits such as a D/A converter and a successive approximation register which are shared in the A/D conversion operation and offset compensation operation may be provided for each operation.

Referring now to FIG. 9, a description will be given of an example of a successive approximation A/D converter which uses a comparator CP having no sample/hold function according to another embodiment of this invention. In FIG. 9 switch $S_{21}$ which is coupled to a sample/hold capacitor $C_{SH}$ selects the analog input voltage $V_A$. A switch $S_{22}$ selects the output of switch $S_{21}$ or the output voltage of an offset compensation analog multiplexer coupled to the other end of the capacitor. The output of switch $S_{22}$ is supplied to an inverting input terminal (−) of comparator CP whose non-inverting input terminal (+) is supplied with the output signal of D/A converter 2. The output signal of comparator CP is supplied to a controller 40, which controls switches $S_{21}$ and $S_{22}$ as well as the output of successive approximation register SAR and analog multiplexer controller 4 in accordance with the comparison result of comparator CP. The output data of register SAR is supplied to D/A converter 2 whose output signal is supplied to the non-inverting input terminal of comparator CP.

The operation of the circuit shown in FIG. 9 will be described below. First, switch $S_{21}$ is thrown to the lower terminal in the diagram. The analog input voltage $V_A$ is sampled in capacitor $C_{SH}$ through switch $S_{21}$ with the offset compensation voltage $V_{OFD}$ being used as a reference. Upon completion of the sampling, switches $S_{21}$ and $S_{22}$ are thrown to the upper terminals in the diagram. The voltage held in capacitor $C_{SH}$ is supplied to the inverting input terminal of comparator CP. It should be noted that the voltage to be supplied to the inverting input terminal of comparator CP has the offset compensation voltage $V_{OFD}$ added thereto. Comparator CP compares two-input voltages and outputs a signal corresponding to the comparison result. Controller 40 changes the content of register SAR in accordance with the output signal of comparator CP. The output of register SAR becomes a digital output of A/D converter.

Even in the A/D converter shown in FIG. 9, an offset compensation cycle is provided once for every N A/D conversion cycles or at random. In this offset compensation cycle, switch $S_{21}$ is turned OFF and second switch $S_{22}$ selects the output $V_{OFD}$ of analog multiplexer 5. D/A converter 2 is supplied with predetermined data, and the pre-set voltage $V_D$ is compared with the offset compensation voltage $V_{OFD}$ by comparator CP. In accordance with the comparison result, controller 40 controls the output voltage $V_{OFD}$ of multiplexer 5 through analog multiplexer controller 4. In this case, the multiplexer output voltage $V_{OFD}$ has the opposite polarity to that of the offset voltage which is generated between the input and output of comparator CP.

When the analog input voltage $V_A$ is selected by switch $S_{21}$ in the A/D conversion cycle, the input voltage $V_A$ is subjected to sampling/holding with the output voltage $V_{OFD}$ of multiplexer 5 being a reference. It therefore means that a value, which has canceled out the offset voltage of comparator CP, has been subjected to sampling/holding.

Although the A/D converter shown in shared in the A/D conversion cycle and compensation cycle, as per the A/D converter shown in FIG. 3.

The A/D converter shown in FIG. 9 also produces the same various effects as produced by the A/D converter described with reference to FIG. 3.

Although the above embodiments have been described with reference to the case where the amplifying factor of amplifier 1 is 1, this invention is not restricted to this particular case and the amplifying factor may take an arbitrary value. With the amplifying factor being G times and the offset voltage of the amplifier being $V_O$, the voltage that is to be added to the input analog voltage would be substantially $-V_O/G$. The key point of this invention lies in that the input signal is added substantially with a signal whose absolute value is equal to a value that is the offset component included in the output signal expressed in terms of an input voltage and whose sign is opposite to the sign of the latter value.

Although a voltage comparison type A/D converter is involved in the above embodiments, this invention can be applied to a current comparison type A/D converter or a charge comparison type A/D converter.

With the use of the successive approximation A/D converters according to the embodiments of this invention, with an input amplifier being inserted to the analog input side, even if an offset voltage is generated in the input amplifier or a comparator for A/D conversion, the offset voltage can be automatically compensated for, thus reducing the offset error. Therefore, the A/D converters embodying this invention are suitable for a wide application to fields such as digital/audio, various measuring, controlling and voice PCM (pulse code modulation) communication fields.

What is claimed is:

1. An A/D converter device having an input and output, said device being of the type having a conversion cycle and a compensation cycle wherein conversion of an analog input signal provided at the input of the device into digital data is carried out during the conversion cycle, and compensation of an offset of the device is carried out during the compensation cycle, comprising:

first means responsive to the input of the device for selecting one of an analog input signal and an offset compensation reference signal, provided to the input of the device;

means responsive to said first selecting means for amplifying a selected signal from the first selecting means;

means for converting digital input data into an analog signal, said converting means includes means for providing a predetermined analog signal;

second means responsive to the amplifying means and converting means for selecting one of an amplified signal and an analog signal provided from said converting means;

means for comparing a selected signal from the second selecting means with a reference signal to output a signal therefrom;

means for providing said reference signal to the comparing means;

means for providing digital data to the converting means in response to a signal output from the comparing means;

means coupled to the amplifying means for providing an analog offset compensation signal to the amplifying means, said analog offset compensation signal being added to the selected signal from said first selecting means;

means for controlling said first and second selecting means;

means coupled to said comparing means for holding the signal output from the comparing means; and an output circuit, coupled to the means for providing digital data, for providing the digital data to the output of said A/D converter device, said controlling means further comprising means for providing that, during the conversion cycle, said first selecting means selects said analog input signal, said second selecting means selects said amplified signal, and said holding means holds the signal output from said comparing means, and, when conversion of the analog input signal to a digital signal is completed, said second selecting means selects said signal from said converting means, the comparing means compares said selected signal from the converting means with said reference signal provided to the comparing means, and said means for providing digital data to the converting means provides the digital data in accordance with the signal output from the comparing means, the analog input signal added to the analog offset compensation signal to convert the sum into a digital signal, and said controlling means comprising means for providing that, during the compensation cycle, the converting means provides a predetermined analog signal to the comparing means, the first selecting means selects said offset compensation reference signal, the second selecting means selects said amplified signal, and said holding means holds the signal output from the comparing means and, when compensation of the offset of the device is completed, the second selecting means selects the predetermined analog signal from the converting means, the comparing means compares the predetermined analog signal with said reference signal provided to the comparing means, and said means for providing an analog offset compensation signal provides the analog offset compensation signal in accordance with the signal output from the comparing means the provided analog offset compensation signal compensating the offset of the converted signal.

2. The A/D converter device according to claim 1, wherein said converting means and said means for providing an analog offset compensation signal includes means commonly coupled thereto for providing a plurality of analog signals.

3. The A/D converter device according to claim 1, said controlling means comprising means for providing that, said means for providing digital data decreases the value of a provided digital data when a converted analog signal from the converting means is greater than said reference signal, and increases the value of said provided digital data when a converted analog signal from the converting means is smaller than said reference signal; and said controlling means comprising means for providing that, said means for providing an offset compensation signal decreases the level of a provided offset compensation signal when a provided predetermined analog signal from the converting means is smaller than said reference signal, and increases the level of the offset compensation signal when said provided predetermined analog signal is greater than said reference signal.

4. An A/D converter device having an input and output, said device being of the type having a conversion cycle and a compensation cycle wherein conversion of an analog input signal provided at the input of the device into digital data is carried out during the conversion cycle, and compensation of an offset of the device is carried out during the compensation cycle, comprising:

means for converting digital input data into an analog signal, said converting means including means for providing a predetermined analog signal;

means for holding an analog input signal;

means coupled to the holding means and the input of the device for adding a held signal from said holding means and an offset compensation signal provided at the input of the device, in an analog form;

means coupled to the input of the device and the adding means for selecting one of a provided offset compensation signal and an added signal;

means coupled to the selecting and converting means for comparing a converted signal with a selected signal;

means for providing digital data to the converting means;

means for controlling said selecting, converting, and adding means; and an output circuit coupled to the means for providing digital data to the output of the A/D converter device, said controlling means further comprising means for providing that, during the conversion cycle, the selecting means selects said held signal and the converting means converts the digital data in accordance with the result of said comparing means, and said controlling means comprising means for providing that, during the compensation cycle, the selecting means selects said provided offset compensation signal, and said adding means, in accordance with the comparison result of said comparing means, adds a selected offset compensation signal to said held signal to compensate the offset of said device.

5. The A/D converter device according to claim 4, wherein said converting means and said means for adding includes means for providing a plurality of analog signals.

6. The A/D converter device according to claim 4, said controlling means comprising means for providing that, said means for providing digital data decreases the value of a provided digital data when the level of converted signal from the converting means is greater than the level of said held signal, and increases the value of the provided digital data when the level of the converted signal is smaller than the level of the held signal, and said controlling means comprising means for providing that, said adding means decreases the level of said provided offset compensation signal when said provided predetermined analog signal is smaller than said held signal, and increases the level of said provided offset compensation signal when said provided predetermined along signal is greater than said held signal.

7. An A/D converter device having an input and output, said device having a conversion cycle and a compensation cycle wherein conversion of an analog input signal provided at the input of the device into digital data is carried out during the conversion cycle, and compensation of an offset of the device is carried out during the compensation cycle, comprising:

means for converting an analog input signal provided to the input of the device into digital data;

means for providing a predetermined reference signal to said converting means during the compensation cycle;

means for determining the amount of an offset of the converting means when said reference signal is provided to said converting means;

means responsive to said offset determining means for providing an analog compensation signal which compensates the offset of the converting means;

means coupled to said means for providing an analog compensation signal for adding in analog form a provided compensation signal to said analog input signal provided to the input of the device; and an output circuit, coupled to said adding means, for providing a converted input signal to the output of the A/D converter device, an added signal compensating the offset of said converting means during the conversion cycle.

8. An A/D converter device having an input and output, comprising:

means responsive to the input of the device for amplifying an analog input signal and an offset compensation reference signal provided to the input of the device;

converting means including means for providing digital data to the output of said device, means for providing an analog conversion signal corresponding to provided digital data, and means for providing a predetermined analog signal for compensating offset;

comparing means, responsive to said amplifying and converting means, including means for sampling an amplified analog input signal and offset compensation reference signal, and means for comparing a sampled analog input signal with a provided analog conversion signal, and comparing a sampled offset compensation reference signal with a provided predetermined analog signal provided from the converting means for offset compensation;

means for providing a compensation signal to compensate the offset of the converting means;

means for adding said sampled analog input signal and a provided offset compensation signal; and control means for controlling a provided digital data from the converting means in accordance with the result of said comparing of said sampled analog input signal with said provided analog conversion signal, for A/D conversion, and controlling the level of the provided offset compensation signal in accordance with the result of said comparing of said sampled offset compensation reference signal with said provided predetermined analog signal, for offset compensation.

9. The A/D converter device according to claim 8, said control means comprising means for providing that said means for providing a compensation signal holds the provided compensation signal until a next offset compensation is provided.

10. The A/D converter device according to claim 8, wherein said amplifying means includes:

means for selecting one of said provided analog input signal and offset compensation signal; and means responsive to said selecting means for amplifying a selected signal.

11. The A/D converter device according to claim 8, wherein said comparing means includes:

means, responsive to said amplifying means and converting means, for selecting one of an amplified analog input signal from said amplifying means and a provided analog conversion signal from said converting means;

comparator circuit means having one input terminal coupled to the output of said selecting means and another input terminal coupled to the output of the comparator circuit means forming a feedback path; and sampling circuit means disposed intermediate the output and another input terminal of said comparator circuit means, for sampling the output from said feedback path of said comparator circuit means responsive to said sampling means for providing a hold signal to said another input terminal of said comparator circuit means when the sampling of the output of said comparator circuit means is completed.

12. The A/D converter according to claim 8, said control means comprising means for providing that said means for providing digital data decreases the level of provided digital data when a provided analog conversion signal corresponding thereto is greater than a sampled analog input signal, and increases the level of the provided digital data when the provided corresponding analog conversion signal is smaller than said sampled analog input signal, and said control means comprising means for providing that said means for providing a compensation signal decreases the level of a provided compensation signal when a provided predetermined analog signal from the converting means is smaller than a sampled offset compensation reference signal, and increases the level of said provided compensation signal when said provided predetermined analog signal is greater than the sampled offset compensation reference signal.

13. The A/D converter device according to claim 8, wherein the converting means and the means for providing a compensation reference signal includes means commonly coupled thereto for providing a plurality of analog signals.

14. An A/D converter device having an input and output, comprising:

means for sampling an analog input signal provided to the input;

means for providing an offset compensation signal;

means for adding a sampled analog input signal to a provided offset compensation signal;

converting means including means for providing digital data to the output of said device, means for converting provided digital data into an analog signal, and means for providing a predetermined reference signal for offset compensation;

means for comparing a provided predetermined reference signal from the converting means an added analog input signal from the adding means for A/D conversion, and comparing said provided offset compensation signal with said provided predetermined reference signal for offset compensation; and means, coupled to said comparing means, for controlling the level of said provided offset compensation signal and digital data.

15. The A/D converter device according to claim 14 wherein said means for providing a compensation signal holds a provided compensation signal until next offset compensation is provided.

16. The A/D converter device according to claim 14, said controlling means comprising means for providing that said means for providing digital data decreases the value of said provided digital data when the level of said provided predetermined reference signal is greater than said added analog input signal, and increases the value of said provided digital data when the level of said provided reference signal is smaller than said added analog input signal, and said controlling means comprising means for providing that said means for providing an offset compensation signal decreases the level of said provided offset compensation signal when said provided predetermined reference signal is smaller than said added analog input signal, and increases the level of said provided offset compensation signal when said provided predetermined reference signal is greater than said added analog input signal.

17. The A/D converter device according to claim 14, wherein the converting means and the means for providing an offset compensation reference signal includes means commonly coupled thereto for providing a plurality of analog signals.

* * * * *